US008819353B2

(12) United States Patent
Math et al.

(10) Patent No.: US 8,819,353 B2
(45) Date of Patent: Aug. 26, 2014

(54) HOST BUS ADAPTERS WITH SHARED MEMORY AND BATTERY BACKUP

(75) Inventors: Kiran Math, Bangalore (IN); Neresh Madhusudana, Bangalore (IN); Erik Paulsen, Colorado Springs, CO (US)

(73) Assignee: LSI Corporation, San Jose, CA (US)

( * ) Notice: Subject to any disclaimer, the term of this patent is extended or adjusted under 35 U.S.C. 154(b) by 308 days.

(21) Appl. No.: 13/523,998

(22) Filed: Jun. 15, 2012

(65) Prior Publication Data

US 2013/0339594 A1 Dec. 19, 2013

(51) Int. Cl.
*G06F 12/00* (2006.01)
(52) U.S. Cl.
USPC .......................................................... 711/153
(58) Field of Classification Search
None
See application file for complete search history.

(56) References Cited

U.S. PATENT DOCUMENTS

2010/0017496 A1* 1/2010 Kimmel et al. ............... 709/212

OTHER PUBLICATIONS

Scouras, "RAID-on-Chip controller brings SAS storage to the masses", © 2006 EE Times, p. 1-3.*

* cited by examiner

*Primary Examiner* — Brian Peugh
(74) *Attorney, Agent, or Firm* — Suiter Swantz pc llo (57) ABSTRACT

The present disclosure includes methods and systems that share memory located on one PCIe based HBA across other PCIe based HBAs in the system. In addition, the backup battery is effectively shared across multiple PCIe based HBAs in the system. This approach saves significant costs by avoiding the need to have a separate DRAM with its own dedicated battery backup on each HBA board in the system. This also allows the redundant memory and backup batteries to be removed while still retaining the same functionality through the common DDR3 memory chip and battery backup shared across multiple HBAs in the system. The component cost for batteries and memory, management module, board space, and the board manufacturing cost are all reduced as a result.

23 Claims, 6 Drawing Sheets

HOST BUS ADAPTERS WITH SHARED MEMORY AND BATTERY BACKUP

TECHNICAL FIELD

The present disclosure relates to computer systems and, more particularly, to computer systems with Host Bus Adapters (HBAs) connected to Periphery Component Interconnect Express (PCIe) interfaces, such as RAID On Chip (ROC) memory boards, using shared Double Data Rate Type 3 (DDR3) memory with battery backup.

BACKGROUND

Host Bus Adapters (HBAs) connected to Periphery Component Interconnect Express (PCIe) interfaces may be used to drive a variety of peripheral devices, such as RAID On Chip (ROC) backup memory systems. Many PCIe based HBA solutions, such as a ROC HBA, provide a battery backed DRAM, typically a DDR3 memory chip, on the HBA board. Battery back-up DRAM is an option to retain the contents of the memory when there is an unexpected power loss, which is an important feature of an ROC based HBA. In order to increase performance, reduce device failure vulnerability, and provide redundant paths, many PCIe based HBAs may be included in a single server.

ROC applications typically include three or more ROCs implemented on separate HBAs. Currently, each PCIe connected ROC in a multiple ROC system requires a separate DDR3 memory with its own dedicated battery located on each HBA board. This results in replication of the battery and the DRAM memory on each HBA board. The functionality of each battery and DRAM is the same and the replication of these components over multiple HBAs adds considerable cost and complexity to the system. There is, therefore, a continuing need for improved HBA technology for PCIe implementations.

SUMMARY

The present disclosure solves the problems identified above through unique methods and systems that share memory located on one PCIe based HBA across other PCIe based HBAs in the system. In addition, the backup battery is effectively shared across multiple PCIe based HBAs in the system. This approach saves significant costs by avoiding the need to have a separate DRAM with its own dedicated battery backup on each HBA board in the system. The disclosure therefore allows the redundant memory and backup batteries to be removed while still retaining the same functionality through the common DDR3 memory chip and battery backup shared across multiple HBAs in the system. The component cost for batteries and memory, management software, board space, and the board manufacturing cost are all reduced as a result.

It is to be understood that both the foregoing general description and the following detailed description are exemplary and explanatory only and are not necessarily restrictive of the disclosure as claimed. The accompanying drawings, which are incorporated in and constitute a part of the specification, illustrate embodiments of the disclosure and together with the general description, serve to explain the principles of the disclosure.

BRIEF DESCRIPTION OF THE DRAWINGS

The numerous advantages of the disclosure may be better understood with reference to the accompanying figures in which.

DETAILED DESCRIPTION OF ILLUSTRATIVE EMBODIMENTS

The disclosure may be embodied in unique shared memory and battery backup systems for multiple Host Bus Adapters (HBAs) connected to Periphery Component Interconnect Express (PCIe) interfaces used to drive a variety of peripheral devices, such as RAID On Chip (ROC) backup memory system. Although ROCs will be used as a specific example to illustrate the disclosure, it will be appreciated that any other multi-board HBA system may utilize the same technology.

Many PCIe based HBA solutions utilizing multiple HBA boards provide a battery backed DRAM, such as a DDR3 memory chip, on each HBA board in the system. Battery back-up is an option to retain the contents of the memory when there is an unexpected power loss. ROC systems are an example of this type of architecture, in which multiple HBA boards, each implementing an ROC, includes a DDR3 memory chip with its own dedicated backup battery. The replication of the battery and the DDR3 memory chip on each HBA board adds significant cost to the system. Management software is also required on all of the PCIe HBAs to manage the contents of the DDR3 memory when power loss occurs.

The present disclosure solves the problems encountered in prior HBA architectures through unique methods and systems that share memory located on one of the PCIe based HBA's across other PCIe based HBAs in the system. Avoiding the duplication of memory and battery units, while still retaining the same functionality, reduces the cost of the system significantly. As a result, the component cost for batteries and memory, management software, board space and board manufacturing cost of the system are all reduced.

A typical ROC system utilizes 3 GB of DDR3 memory, which is conventionally implemented using three HBAs, each having an individual 1 GB DDR3 DIMM. Utilizing three 1 GB DDR3 chips is a more costly configuration when compared to a single 4 GB DIMM, which provides a greater amount of memory at lower cost by consolidating the memory into a single chip. Further adding to the cost of the conventional approach are the multiple batteries utilized to backup each of the individual DDR3 chips. Management software, board space and manufacturing cost are likewise reduced by sharing a consolidated memory and associated backup battery across multiple HBAs.

In practice, a typical PCIe based HBA can support up to 16 GB of DDR3 memory. 4 GB and 8 GB DDR3 DIMMs presently available in the market can therefore be utilized to implement a wide range of shared memory HBA applications, such as ROC systems. As an average ROC implementation only requires 1 GB of DDR3 memory, the disclosure allows a single DDR3 memory and associated backup battery to be shared over as much as 16 HBAs using currently available PCIe components.

Figure 1:
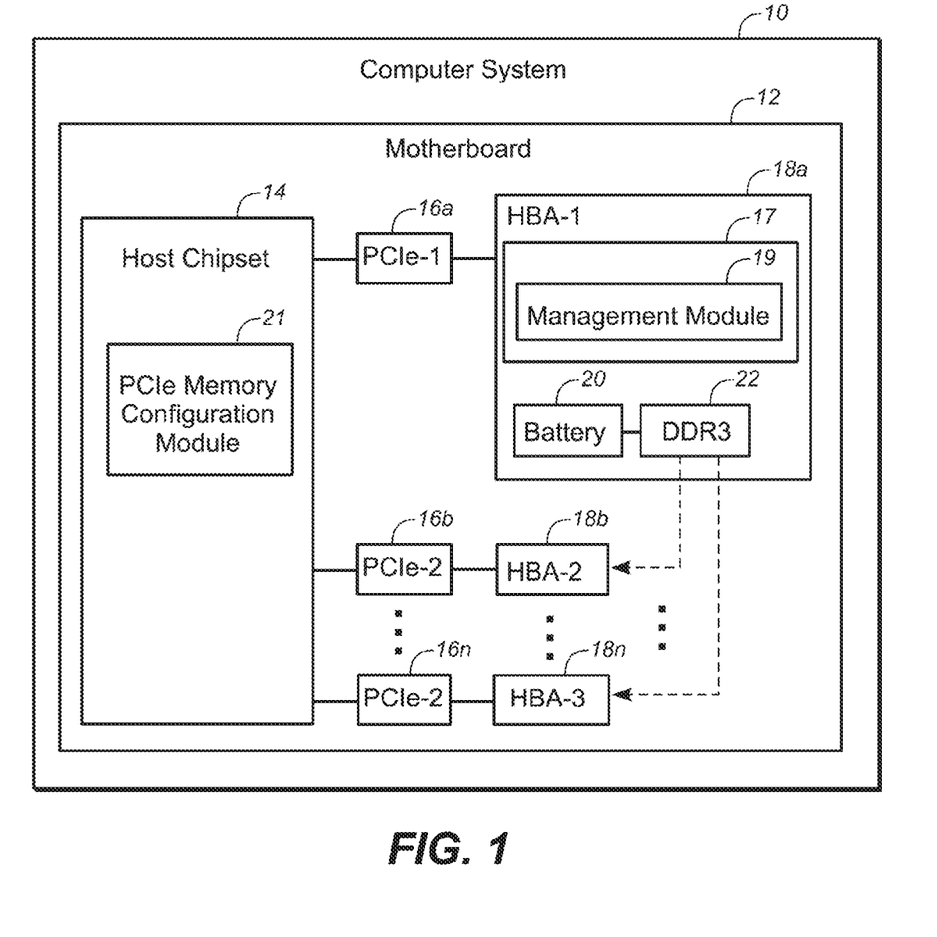
FIG. 1 is a functional block diagram of a computer system with multiple PCIe connected HBAs utilizing shared DDR3 memory and an associated backup battery located on a host Server.

Referring now to FIG. 1, an example of a multiple PCIe based HBA system utilizing shared memory and backup battery is shown. A computer system 10 includes a motherboard 12 with a host chipset 14 supporting multiple PCIe interfaces 16a-n. Each PCIe interface typically includes a slot connected to the motherboard into which an HBA board is inserted. This is represented by the HBAs 18a-n connected to the PCIe interfaces 16a-n. To implement the present disclosure, a first HBA 18a includes a processor 17 configured to implement a management module 19, backup battery 20 and a DDR3 memory 22. The first HBA 18a includes the backup battery 20 and a DDR3 memory 22. The DDR3 memory 22 located on the host HBA 18a is partitioned and shared among the host HBA 18a and the other HBAs 18b-n that do not carry their own DRAM or battery. Because the DRAM for all of the HBAs 18a-n is located on the host HBA 18a, the backup battery 20 as well as the DDR3 memory 22 is effectively shared among all of the HBAs 18a-n. A PCIe memory configuration module 21 in host chipset configures the HBAs 18b-n to access the DDR3 memory 22 through PCIe.

Figure 2:
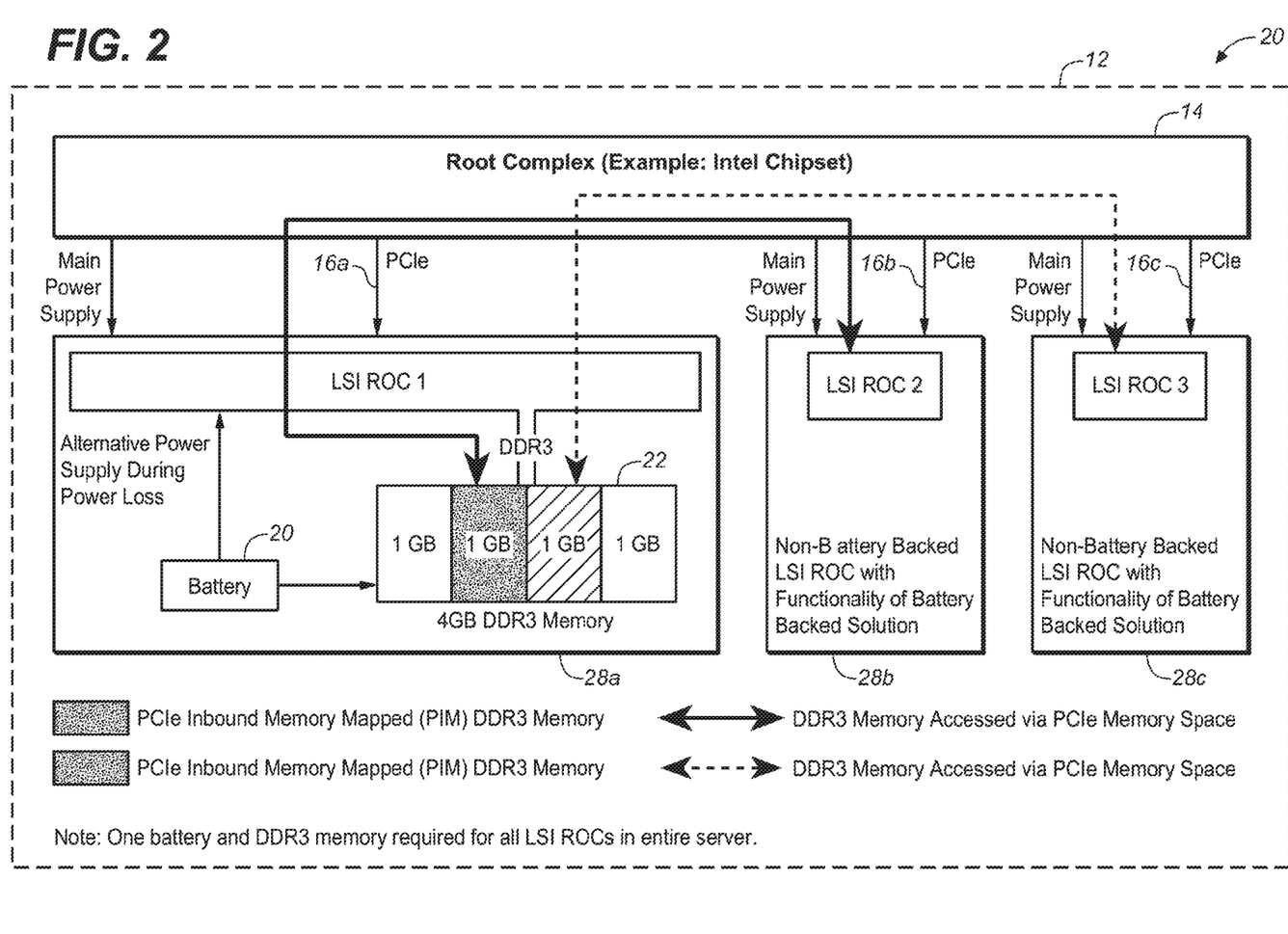
FIG. 2 is a functional block diagram of a multiple ROC system implemented on multiple PCIe connected HBAs utilizing shared DDR3 memory and an associated backup battery located on a host ROC.

FIG. 2 shows a particular example, in this case a three-board ROC system 20 utilizing the disclosure. The host chipset 14 implements three PCIe interfaces 16a-c, which each include a slot for receiving a respective ROC implemented on a HBA board. Three ROCs 28a-c implemented on the three HBAs are connected to the PCIe interfaces 16a-c, respectively. The host ROC 28a includes a backup battery 20 and a 4 GB DDR3 memory 22, which is partitioned into four 1 GB sectors. A first 1 GB sector of the 4 GB DDR3 memory 22 is allocated to implementing the first ROC 28a on the host HBA. A second 1 GB sector of the 4 GB DDR3 memory 22 is allocated to the second ROC 28b and a third 1 GB sector of the memory 22 is allocated to the third ROC 28c.

The solution provided by the present disclosure shares the backup battery 20 and the 4 GB DDR3 memory 22 on the first ROC 28a among the three ROCs 28a-c. The size of the DDR3 memory should be sufficient to support the number of ROCs present in the computer system 12, in this example a single 4 GB DDR3 chip is sufficient to provide the DRAM needed for all three ROC 28a-c. The consolidated battery-backed DDR3 memory 22 on the ROC 28a host is partitioned and mapped to the PCIe memory space in order to allow the other PCIe ROCs 28b-c to access their chunk of DDR3 memory via PCIe accesses.

In the conventional configuration, a management module is required on all of the PCIe based ROCs in a multi-board ROC system to manage the contents of DDR3 memory when power loss occurs. In the improved configuration of the present disclosure, the non-host ROCs 28b-c are less complicated and smaller in size as these boards do not need DDR3 pins and signal routing on each HBA board. Instead, they use PCIe mapped memory located on the host ROC 28a. This may be configured through the preexisting PCIe protocol, which is a proven capability provided by the manufacturer, which is already present in widely available HBAs. Utilizing the preexisting PCIe protocol reduces the risk and development time for the implementation.

More specifically, on currently available PCIe based HBAs, the memory allocation protocol may use a ROC (for example, Thunderbolt (2208)) as the host ROC 28a and allow usage of low cost bond option for the non-host ROCs 28b-c (for example, Mustang (2308)) that do not have DDR3 interfaces. The Mustang in the non-host ROCs 28b-c will have their DDR3 accesses mapped to the DDR3 on the host ROC 28a via PCIe interface to achieve a low cost implementation of the current disclosure.

Figure 3:
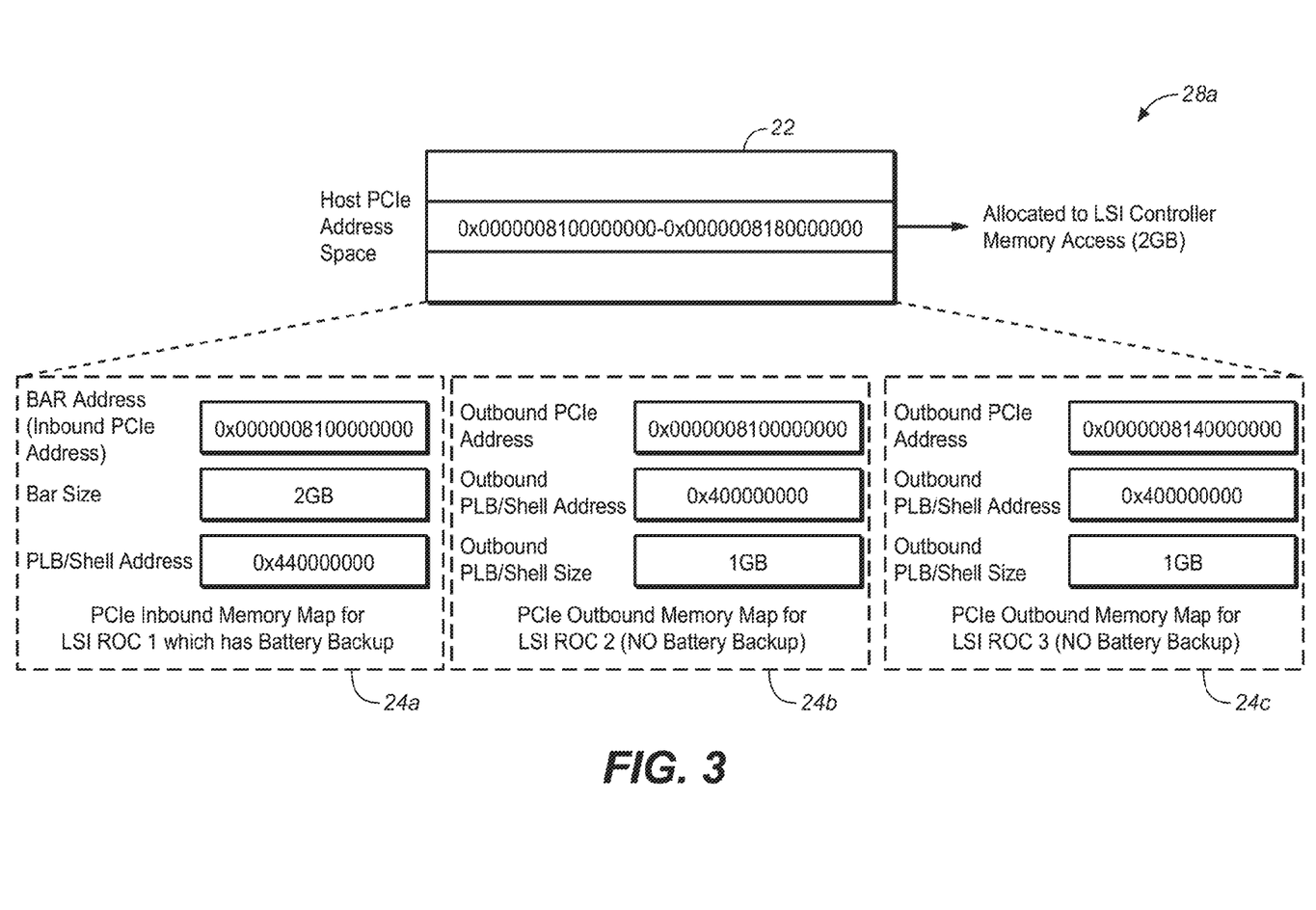
FIG. 3 is a mapping diagram of DDR3 memory on the host PCIe based HBA allocated to multiple PCIe connected HBAs in the system.

FIG. 3 shows the mapping of the DDR3 memory 22 on the host ROC 28a mapped to the PCIe memory space via the PCIe inbound memory and accessed by the PCIe outbound memory access for the ROC based HBAs 28b-c. The PCIe memory configuration module 21 running in the host chipset server allocates the PCIe address space on the host chipset to the required memory range. The PCIe memory configuration module 21 running in the host chipset also configures the non-host ROCs 28b-c with the appropriate destination memory addresses. It should be noted that in this process, the PCIe memory configuration module 21 running in the host chipset 14 maps the memory accesses to all three ROCs 28a-c and, in doing so, makes sure that there is no overlap in the memory allocated to different ROCs 28a-c.

Figure 4:
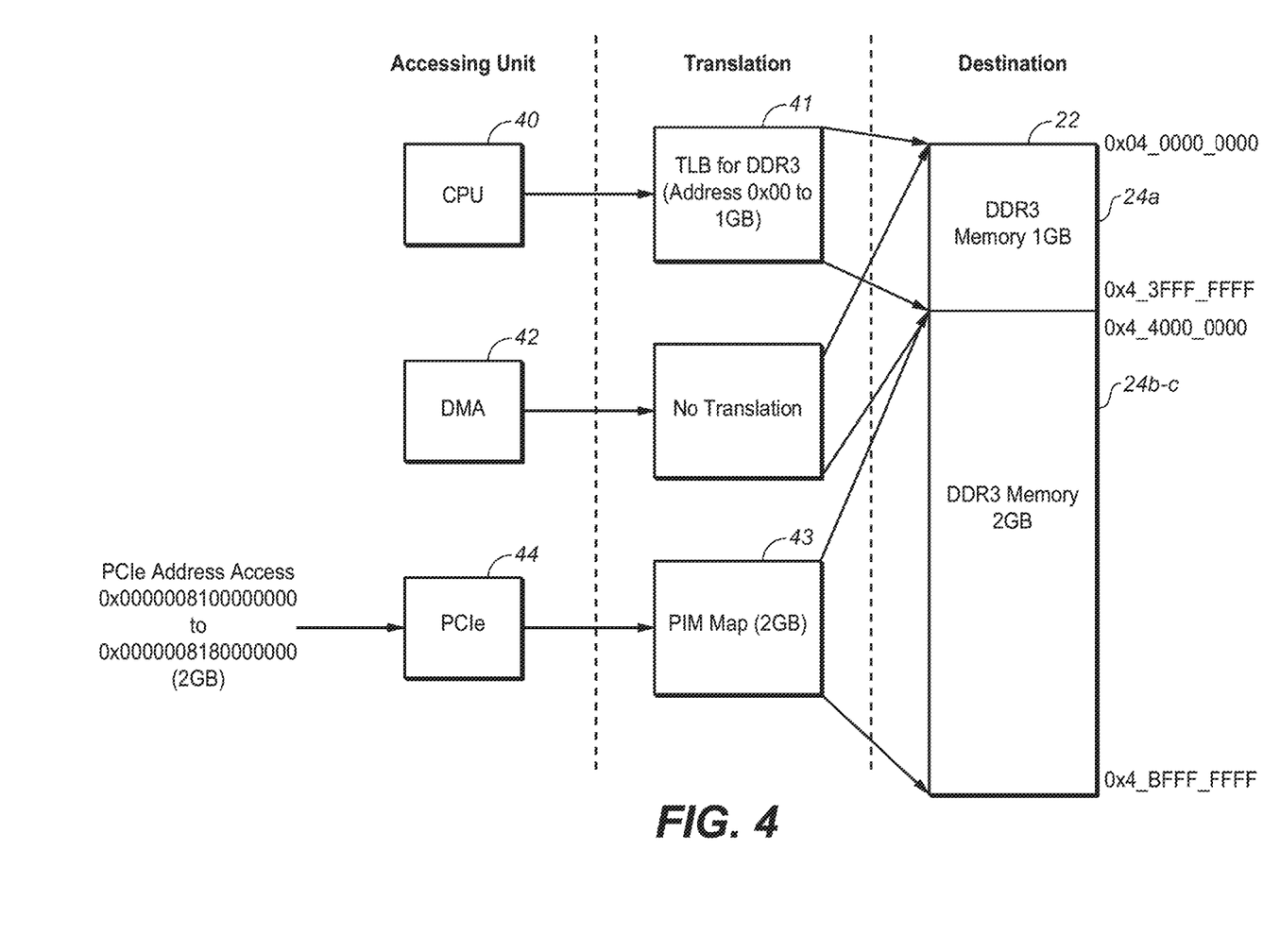
FIG. 4 is a memory mapping diagram of the DDR3 memory on the host PCIe connected HBA.

FIG. 4 illustrates the resulting memory mapping internal to the host ROC 28a. Memory requests from the CPU 40 present in the ROC 28a are routed to the ROC memory partition 24a for the host ROC via a translation lookaside buffer (TLB) 41 in the usual manner. In addition, memory requests from the DMA engine 42 within ROC 28a are routed to the ROC memory partition 24a for the host ROC without translation. On the other hand, memory requests from the PCIe controller 44 which are routed from the non-host ROCs 28b-c are serviced via a PCIe Inbound Memory (PIM) 43. As a result, the memory access is local for the ROC 28b, which has the DDR3 memory module connected. The DDR3 memory access for the non-host ROCs 28b-c is partitioned on the host ROC 28a and mapped to the PCIe inbound memory 24b-c of the ROC 28a.

Figure 5:
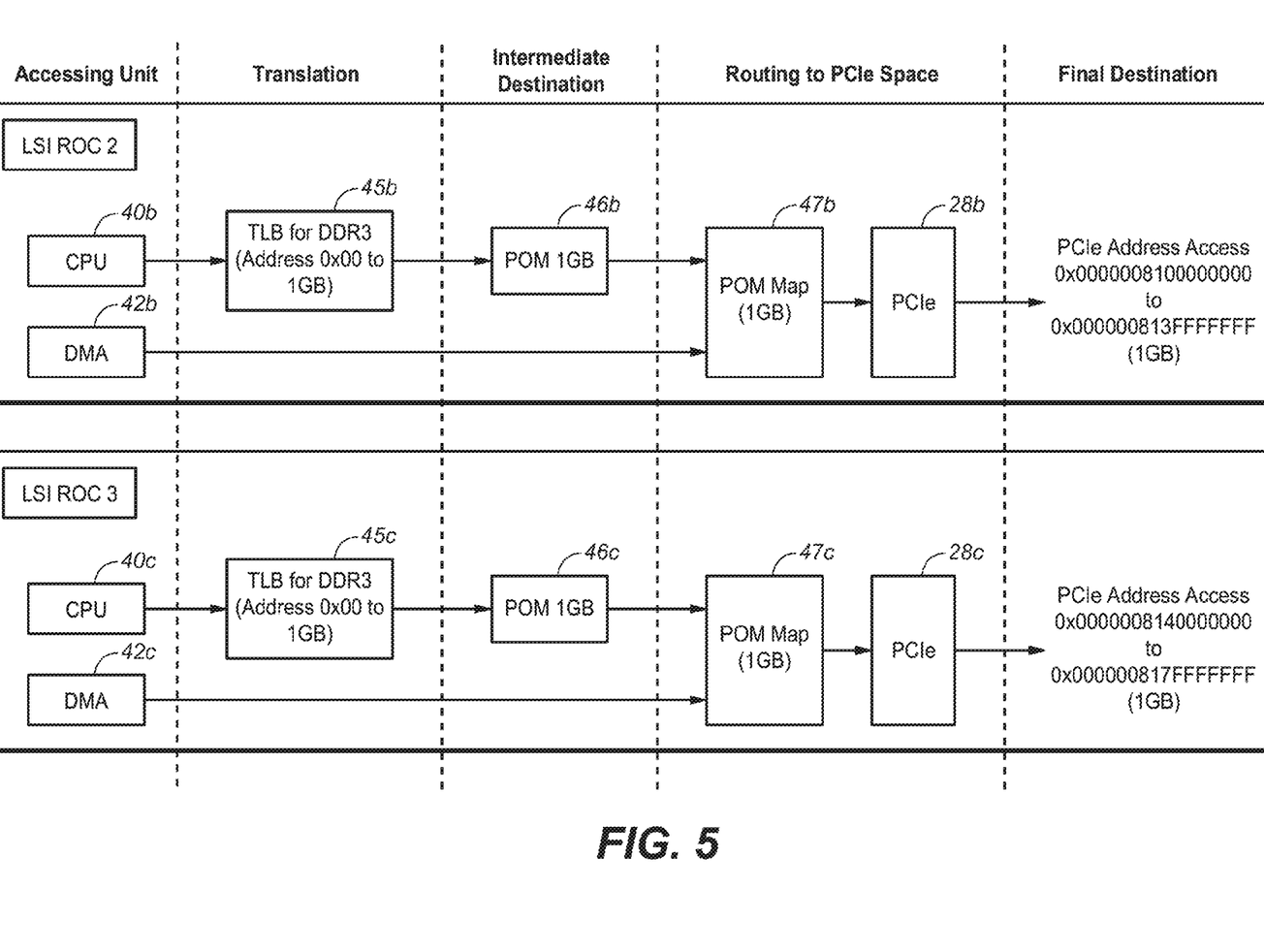
FIG. 5 is a mapping diagram of the DDR3 memory to the non-host HBAs without onboard memory.

In the LSI PCIe ROC HBAs which do not have local DDR3 memory, the DDR3 memory access is mapped to the PCIe inbound memory of the host ROC 28a. FIG. 5 illustrates the resulting memory mapping on the non-host ROCs 28b and 28c. The non-host ROC 28b, memory requests from the CPU 40b present in ROC 28b are routed to the translation lookaside buffer (TLB) 45b; from the TLB to an intermediate PCIe Outbound map (POM) 46b; from the intermediate POM 46b to the PCIe routing space POM 47b, which then results in PCIe accesses of ROC 28b routed to ROC 28a via PCIe interface 44 in FIG. 4. In addition, memory requests from the DMA 42b present in ROC 28b are routed to the PCIe POM space 47b and then to the PIM of PCIe based ROC 28a. Similarly, referring to the non-host ROC 28c, memory requests from the CPU 40c present in ROC 28c are routed to the translation lookaside buffer (TLB) 45c, from the TLB to an intermediate PCIe Outbound map (POM) 46c, from the intermediate POM 46c to the PCIe routing space POM 47c, which generates PCIe access of ROC 28c routed to the PCIe space of ROC 28a. In addition, memory requests from the DMA 42c present in ROC 28c are routed to the PCIe routing space POM 47c and on to the PIM of PCIe based ROC 28a.

With the current disclosure, the non-host ROCs 28b-c do not require DDR3 memory interface implemented in them. This presents another opportunity for cost savings by implementing these ROCs on lower pin count versions of the original ROC. With this option the DDR3 memory controller and the pins need not be implemented on the non-host ROCs 28b-c, thus reducing the production cost and hence the total cost of the solution but preserving the functionality of the overall solution. As another alternative, all of the ROCs could be implemented on a single HBA with a PCIe switch in the HBA connecting the ROCs. This option further reduces the cost of the solution and also the board space consumed.

Figure 6:
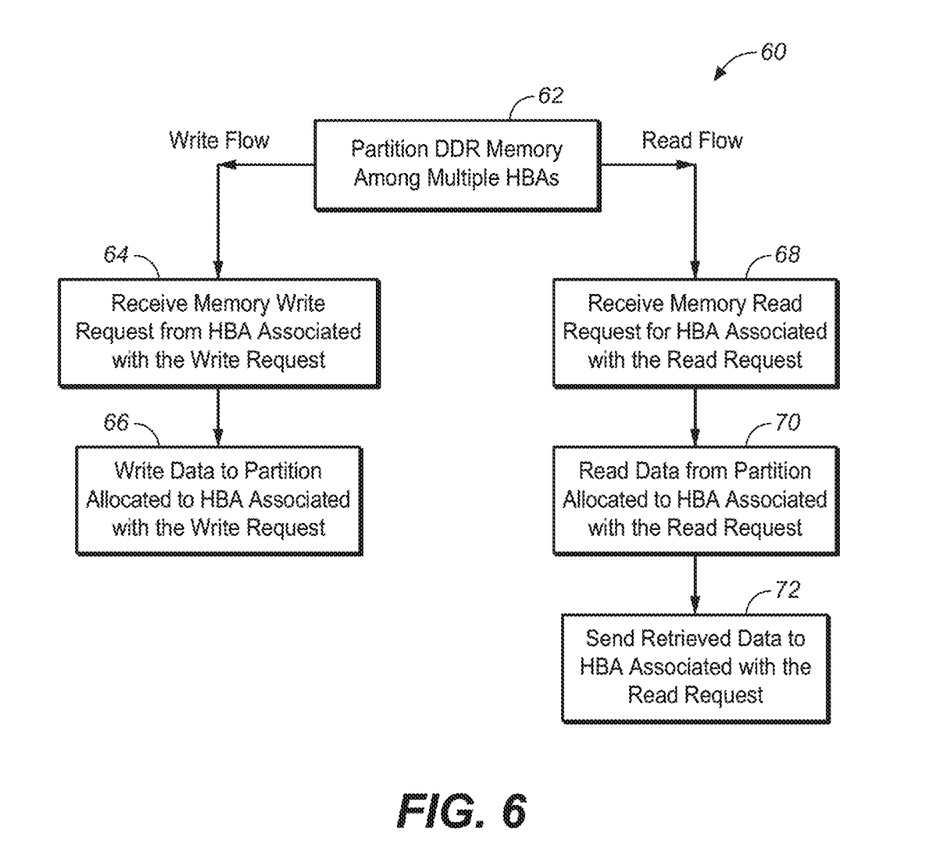
FIG. 6 is a logic flow diagram for a host HBA in a multiple HBA system utilizing shared memory and associated backup battery located on the host HBA.

Referring to FIGS. 1 and 6, FIG. 6 is a logic flow diagram illustrating Routine 60 for operating the management module 19 running on the host HBA 18a in the multiple HBA system 12 shown on FIG. 1 utilizing the shared memory 22 and associated backup battery 20 located on the host HBA 18a. In step 62, the host HBA 18a provisions the shared memory 22 by partitioning the memory and allocates respective partitions to the HBAs 18a-n. For a write request, step 62 is followed by step 64, in which the HBA 18a receives a memory write request associated with a particular one of the HBAs 18b-n. Step 64 is followed by step 66, in which the HBA 18a writes the data to the memory partition allocated to the particular one of the HBAs 18b-n associated with the write request.

For a read request, Step 62 is followed by step 68, in which the HBA 18a receives a memory read request associated with a particular one of the HBAs 18b-n. Step 68 is followed by step 70, in which the HBA 18a reads the data from the memory partition allocated to the particular one of the HBAs 18b-n associated with the read request. Step 70 is followed by step 72, in which the HBA 18a sends the retrieved data to the particular one of the HBAs 18b-n associated with the read request. For a data read associated with the Host 18a, the host HBA handles the data in the same manner it would be handled in a conventional HBA, which may vary depending on the type of HBA and read request. It will also be understood that read and write requests may occur in any order and sequence as determined by the actual computer usage. Routine 60 thus results in sharing of the memory 22 and associated backup battery 20 regardless of how the HBAs operate to implement their respective functions.

The present disclosure may consist (but not required to consist) of adapting or reconfiguring presently existing systems. Alternatively, original equipment may be provided embodying the disclosure.

The computer system may include, but is not limited to, a personal computer system, mainframe computer system, workstation, image computer system, parallel processor, or any other device known in the art. In general, the term "computer system" may be broadly defined to encompass any device having one or more processors, which execute instructions from a memory medium.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the disclosure is defined by the appended claims.

Although particular embodiments of this disclosure have been illustrated, it is apparent that various modifications and embodiments of the disclosure may be made by those skilled in the art without departing from the scope and spirit of the foregoing disclosure. Accordingly, the scope of the disclosure should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

The invention claimed is:

1. A computer system comprising:
    a motherboard comprising a host chipset operatively coupled to a plurality of peripheral component interfaces;
    a first host bus adapter operatively coupled to a first peripheral component interface on the motherboard;
    the first host bus adapter comprising a dynamic random access memory comprising memory address space and a processor;
    a second host bus adapter operatively coupled to a second peripheral component interface, and
    a memory configuration module configured to control the memory address space in the dynamic random access memory, partition the dynamic random access memory on the first host bus adapter, and allocate the partitioned dynamic random access memory for use by the first and second host bus adapters, wherein memory access to the second host bus adapter will be only mapped to the dynamic random access memory of the first host bus adapter.

2. The computer system of claim 1, wherein the first host bus adapter further comprises a backup battery whereby the dynamic random access memory used by the first and second host bus adapters is backed up by the battery on the first host bus adapter.

3. The computer system of claim 1, wherein the first peripheral component interface is a PCIe interface.

4. The computer system of claim 1, further comprising a third host bus adapter operative coupled to a second peripheral component interface on the motherboard, wherein the memory configuration module further partitions the dynamic random access memory on the first host bus adapter and allocates the partitioned dynamic random access memory for use by the first, second and third host bus adapters, wherein memory access to the third host bus adapter will be only mapped to the dynamic random access memory of the first host bus adapter.

5. The computer system of claim 4, wherein the first host bus adapter further comprises a backup battery whereby the dynamic random access memory used by the first, second and third host bus adapters is backed up by the battery on the first host bus adapter.

6. The computer system of claim 5, wherein the first, second and third host bus adapters implement respective raid on chip backup memory devices.

7. The computer system of claim 6, wherein the first and second peripheral component interfaces are a PCIe interfaces.

8. The computer system of claim 1, wherein the host chipset implements the memory configuration module.

9. A host bus adapter system for a computer system, comprising:
    a first host bus adapter configured for operable connection to a first peripheral component interface;
    the first host bus adapter comprising a dynamic random access memory comprising memory address space;
    a second host bus adapter configured for operable connection to a second peripheral component interface; and
    a memory configuration module configured to control the memory address space in the dynamic random access memory, partition the dynamic random access memory on the first host bus adapter, and allocate the partitioned dynamic random access memory for use by the first and second host bus adapters, wherein memory access to the second host bus adapter will be only mapped to the dynamic random access memory of the first host bus adapter.

10. The host bus adapter system of claim 9, wherein the first host bus adapter further comprises a backup battery whereby the dynamic random access memory used by the first and second host bus adapters is backed up by the battery on the first host bus adapter.

11. The host bus adapter system of claim 9, wherein the first peripheral component interface is a PCIe interface.

12. The comp host bus adapter system of claim 9, further comprising a third host bus adapter configured for operable connection to a second peripheral component interface, wherein the memory configuration module further partitions the dynamic random access memory on the first host bus adapter and allocates the partitioned dynamic random access memory for use by the first, second and third host bus adapters, wherein memory access to the third host bus adapter will be only mapped to the dynamic random access memory of the first host bus adapter.

13. The host bus adapter system of claim 12, wherein the first host bus adapter further comprises a backup battery whereby the dynamic random access memory used by the first, second and third host bus adapters is backed up by the battery on the first host bus adapter.

14. The host bus adapter system of claim 13, wherein the first, second and third host bus adapters implement respective raid on chip backup memory devices.

15. The host bus adapter system of claim 14, wherein the first and second peripheral component interfaces are a PCIe interfaces.

16. The host bus adapter system of claim 9, wherein the host chipset implements the memory configuration module.

17. A method for providing a host bus adapter system for a computer system, comprising:
    providing a first host bus adapter configured for operable connection to a first peripheral component interface;
    providing the first host bus adapter with a dynamic random access memory comprising memory address space;
    providing a second host bus adapter configured for operable connection to a second peripheral component interface; and
    providing a memory configuration module configured to control the memory address space in the dynamic random access memory, partition the dynamic random access memory on the first host bus adapter, and allocate the partitioned dynamic random access memory for use by the first and second host bus adapters, wherein memory access to the second host bus adapter will be only mapped to the dynamic random access memory of the first host bus adapter.

18. The method of claim 17, further comprising the step of providing the first host bus adapter further with a backup battery whereby the dynamic random access memory used by the first and second host bus adapters is configured for backup by the battery on the first host bus adapter.

19. The method of claim 17, further comprising the steps of providing a third host bus adapter configured for operable connection to a second peripheral component interface, wherein the memory configuration module further partitions the dynamic random access memory on the first host bus adapter, and allocates the partitioned dynamic random access memory for use by the first, second and third host bus adapters, wherein memory access to the third host bus adapter will be only mapped to the dynamic random access memory of the first host bus adapter.

20. The method of claim 17, further comprising the step of providing a backup battery on the first host bus adapter whereby the dynamic random access memory used by the first, second and third host bus adapters is backed up by the battery on the first host bus adapter.

21. The method of claim 20, wherein the first, second and third host bus adapters implement respective raid on chip backup memory devices.

22. The method of claim 21, further comprising the step of configuring the first and second peripheral component interfaces as PCIe interfaces.

23. The method of claim 17, further comprising the step of configuring the host chipset to implement the memory configuration module.

* * * * *